(12) United States Patent
Tulloch et al.

(10) Patent No.: US 6,995,565 B1
(45) Date of Patent: Feb. 7, 2006

(54) THERMOGRAPHIC WIRING INSPECTION

(75) Inventors: John S Tulloch, Balderstone (GB); Mark C Jennings, Preston (GB)

(73) Assignee: Airbus UK Limited, Bristol (GB)

(*) Notice: Subject to any disclaimer, the term of this patent is extended or adjusted under 35 U.S.C. 154(b) by 899 days.

(21) Appl. No.: 09/437,226

(22) Filed: Nov. 10, 1999

Related U.S. Application Data

(63) Continuation of application No. PCT/GB99/02548, filed on Aug. 3, 1999.

(30) Foreign Application Priority Data

Aug. 1, 1998 (GB) .................................. 9816737

(51) Int. Cl.
*G01R 31/08* (2006.01)
*H01H 31/00* (2006.01)

(52) U.S. Cl. ...................... 324/514; 324/544; 324/551

(58) Field of Classification Search ................ 324/551, 324/543, 508, 514, 541, 539, 533, 544, 501, 324/702, 703

See application file for complete search history.

(56) References Cited

U.S. PATENT DOCUMENTS

| | | | |
|---|---|---|---|
| 3,015,774 A | * | 1/1962 | Eigen .......................... 324/514 |
| 3,466,537 A | * | 9/1969 | Eigen .......................... 324/536 |
| 3,879,659 A | * | 4/1975 | Lawson, Jr. ................. 324/513 |
| 4,473,795 A | * | 9/1984 | Wood ............................ 324/54 |
| 4,584,523 A | * | 4/1986 | Elabd ........................... 324/96 |
| 4,733,175 A | | 3/1988 | Levinson |
| 5,157,334 A | * | 10/1992 | Lowther ...................... 324/501 |
| 5,574,377 A | * | 11/1996 | Marquez-Lucero et al. . 324/533 |
| 5,624,928 A | * | 4/1997 | Singh .......................... 514/255 |
| 5,637,871 A | * | 6/1997 | Piety et al. .................. 250/330 |
| 6,144,032 A | * | 11/2000 | Gazdzinski .............. 250/358.1 |

FOREIGN PATENT DOCUMENTS

| | | |
|---|---|---|
| GB | 2109927 A | 6/1983 |
| GB | 2174803 A | 11/1986 |

OTHER PUBLICATIONS

"Development of thermographic NDT for the damage inspection in carbon fiber reinforced plastics" by Ogura et al. Jun. 1996. American Soc. Nondestructive Testing, Columbus, OH. p. 420-425.*

"Aircraft Electrical Wet-Wire Arc Tracking" by Cahil et al. Aug. 1988. Federal Aviation Adm. Tech. Center, NJ 08405, 24 pages.*

"Aerospace Wire and Cable" Judd Wire Inc. (Total Seven Pages).*

Patent Abstracts of Japan, vol. 11, No. 378, Dec 10, 1987 & JP 62 147350, Jul. 1, 1987.

Patent Abstracts of Japan, vol. 8, No. 72, Apr. 4, 1984 & JP 58216968, Dec. 16, 1983.

* cited by examiner

*Primary Examiner*—Paresh Patel
(74) *Attorney, Agent, or Firm*—Nixon & Vanderhye P.C.

(57) ABSTRACT

A method for inspecting a wire, a cable or a bundle of wires to locate those parts of said wires or cables having damaged insulation before failure of the wire or cable occurs, the method comprising the steps of:
  passing a current through said wire or cable,
  applying a fluid having electrolytic properties to said wire, cable or bundle of wires,
  using an infra-red thermal imaging system to detect and display the intensity of heat emanating from said wire or cable following addition of the fluid.

25 Claims, 3 Drawing Sheets

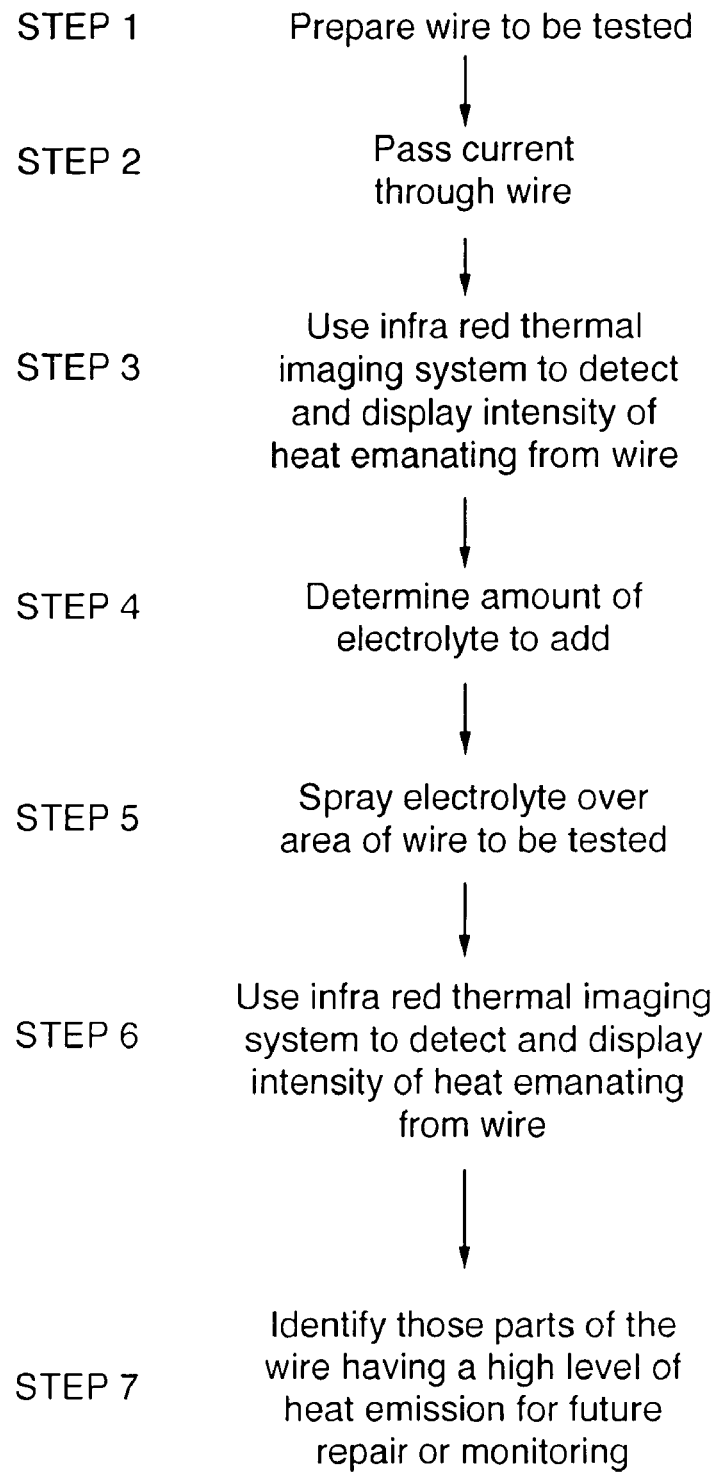

THERMOGRAPHIC WIRING INSPECTION

This application is a continuation of PCT Application No. PCT/GB99/02548, filed 3 Aug. 1999. PCT/GB99/02548 claims priority to GB Application No. 9816737.2 filed 1 Aug. 1998. The entire contents of these applications are incorporated herein by reference.

BACKGROUND OF THE INVENTION

1. Field of the Invention

This invention relates to the field of non-destructive testing and more particularly to the use of infra-red thermography in non-destructive testing of wires and cables.

2. Discussion of Prior Art

This invention relates to the field of non-destructive testing and more particularly to the use of infra-red thermography in non-destructive testing of wires and cables.

For wires and cables intended to carry electrical current, it is generally desirable to be aware of any damage to insulation surrounding the wire or cable, such as cracks or cuts, before such damage can be propagated further. Damage to insulation surrounding wires may eventually result in the wire being exposed to the environment, potentially resulting in a short circuit which may cause the wire to fail or may cause a fire. These potential outcomes are clearly unacceptable, particularly where the wire is carrying current to critical items of equipment or where a fire may be difficult to detect and eliminate, for example, in an aircraft.

It is common practice to test cables or wires, particularly those which have been newly installed, by powering them up and checking that the equipment to which they are connected is functioning. This indicates whether the wire or cable is capable of conducting current, but gives no indication however of the extent of any damage to the wire or insulation which may subsequently cause the wire to fail.

Visual checks of wires and cables are a usual practice in the aircraft industry, particularly in planned maintenance or when damage to the insulation of a cable or wire is suspected, for example, following exposure to higher temperatures than usual. Visual checks can only show damage on the outside surfaces of insulation of a wire or cable and it may be difficult to tell, without removing the wire or cable from an installation, the true extent of the damage. Also where several cables are bundled together into a loom, it can be very difficult to see damage on the insulation of a cable which is surrounded by other cables.

The testing of pre-installed wires and cables, including their terminations, using non-destructive infra-red thermography techniques is known to a limited extent in various industries. One known method is to apply a current to a pre-installed wire or cable and use an infra-red detector to determine the thermal energy emanating from the wire or cable along its length. In regions where the insulation of the wire is intact, the thermal emissions are lower than for areas with insulation damage. The amount of heat radiated by the wire and detected by the detector is proportional to the thickness of the insulator, and so it is possible to determine how badly damaged the wire insulation is in one region from the amount of heat radiated from that region compared to that radiated from the rest of the wire. In this way, partially damaged insulation in wires can be detected and monitored in use to see whether the damage is becoming worse, and the insulation may be changed or repaired before the wire fails.

If a detector were merely pointed at the wire, it may readily detect heat emanating from the part of the circumference to which it had a direct line of sight but any damage on the other part of the circumference would not be so easily detected. Accordingly the known techniques generally involve positioning infra-red detection apparatus around the wire being tested and moving the apparatus along the length of the wire. Positioning detection apparatus around the outer circumference of the wire allows thermal energy emanating from any point on the circumference to be detected.

This technique however has several disadvantages, for example, it is not always possible to position detection apparatus around a wire, for example, when the wires or cables are fixed to run along a wall or when there is little room for detection apparatus or its installation, for example, in the avionics bay of an aircraft. Furthermore it may be difficult to use the detector to locate damage to wires in the centre of a bundle, as the surrounding wires may act as a shield and inhibit temperature variations at that location.

The present invention seeks to overcome these problems and provide a more accurate method of determining the extent of damage to the insulation of wires and cables than hitherto known.

SUMMARY OF THE INVENTION

According to the present invention there is provided a method for inspecting the integrity of the insulation of a wire or cable including the steps of:

passing a current through said wire or cable, applying a fluid having electrolytic properties to said wire or cable, and using a thermal imaging system to detect and display the intensity of heat emanating from said wire or cable.

Those regions of the wire or cable having substantially greater intensity of heat emanating therefrom than adjacent regions of the wire or cable are thereby advantageously identified.

The thermal imaging system advantageously comprises an infra-red detector and a display monitor, said monitor being capable of displaying images.

The thermal imaging system may further include recording means for recording displayed images.

The infra-red detector is preferably a thermal imaging camera. The infra-red detector may be hand held or alternatively it may be stand mounted. The infra-red detector is preferably capable of detecting temperature changes of less than 0.5° C.

The recording means may be adapted to allow images to be stored on computer disks. Alternatively the recording means may be adapted to allow images to be stored on video tape.

The images may be displayed as calibrated spacial thermal images. Preferably a false colour scale is used to represent various temperatures.

The fluid applied to the insulation preferably is capable of conducting a leakage current between sites where there is damage to the insulation. Leakage current measuring means such as an ammeter, or an oscilloscope, for example, may further be provided for measuring this current. Heat is advantageously dissipated on conduction of the leakage current by the fluid, so that where a wire has damaged insulation, a higher temperature is detected in the region of the damage.

Advantageously, damage sites within a bundle of wires or on a substantially inaccessible part of a wire or cable may be detected due to the leakage current being conducted by the fluid away from an immediate damage site.

The fluid may be an aqueous saline solution, preferably containing sodium chloride in the range 1% to 3% by mass.

The fluid may alternatively contain ammonium chloride in the range 1% to 3% by mass. Advantageously the fluid contains 2% sodium chloride by mass.

The fluid may be dripped or sprayed on to the wires, cables or bundle of wires to be inspected. The fluid preferably includes a wetting agent, such as, for example, "Triton X100" for reducing the surface tension of the fluid and thereby preventing large droplets from forming, so that the fluid is capable of spreading over a surface on to which it is applied. The wetting agent thereby allows the fluid to advantageously spread around a wire or cable to be inspected and, for bundles of cables, the fluid may permeate through the bundle so that the insulating materials around the individual wires within the bundle are wet.

The fluid is preferably non-corrosive and preferably is of a type that will not cause substantial degradation of elastomeric polymer insulation around any wires under inspection.

Advantageously, the thermal imaging system is further used to detect and display the intensity of heat emanating from the wire or cable prior to the application of the fluid, to provide datum values of heat emission. Preferably the amount of fluid used is then dependent upon these datum values and the distance between suspected damage sites. Fluid may be added gradually as too much fluid can result in a short circuit, which may cause damage to equipment.

After the application of fluid to the insulation of a bundle of wires, such as a loom within an aircraft for example, the thermal image may be monitored for several minutes. As the fluid dries, the heat emanating from a damaged site may decrease substantially as the fluid becomes less able to conduct a leakage current. The fluid preferably conducts a leakage current between adjacent damage sites, and thereby enhances the intensity of heat emanating from a wire having a damaged insulator, thus allowing damage to the insulation to be more easily detected.

This method may advantageously be applied to the inspection of installed bundles of insulated wires, known as looms on aircraft. Areas of damage to insulation may preferably be detected prior to critical failure, and areas prone to failure may be monitored and the results assessed regularly to look for the onset of damage or to monitor the evolution of known damage.

It will be recognised by one skilled in the art that this method may be applied to the detection of insulation damage in any wires or cables, and is not limited to those on aircraft.

BRIEF DESCRIPTION OF THE DRAWINGS

In order to more fully understand the present invention, the following embodiments are described by way of example only and with reference to the accompanying drawings in which:

FIG. 3 shows a flow chart of a preferred method in accordance with the present invention.

DETAILED DISCUSSION OF PREFERRED EMBODIMENTS

Figure 1A:
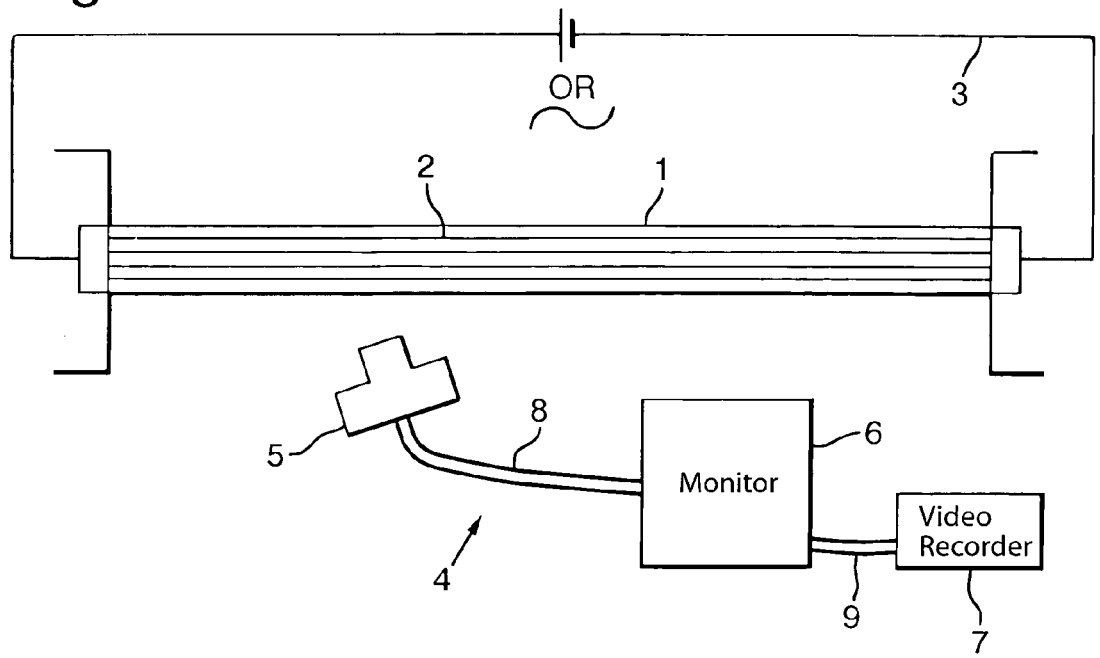
FIGS. 1a and 1b show schematic plan views of apparatus used in two steps of a method according to the present invention.

FIG. 1a shows a loom 1, comprising several cables 2, which form part of the avionics system of an aircraft (not shown). The loom 1 is connected to form part of an electrical circuit 3 for allowing either alternating or direct current to flow through the cables 2. An infra-red thermal imaging system 4 is shown, which comprises an infra-red thermal imaging camera 5, a display monitor 6 and a video recorder 7. The camera 5 is connected to the display monitor 6 by cables 8. The monitor 6 is for displaying the thermal images detected by the camera 5 and these images may then be recorded by the video recorder 7, which is connected to the monitor 6 by cables 9.

In operation, the loom is connected to an electrical circuit which is then switched on. As current flows through the loom 1, heat is dissipated by the cables 2 and this is detected by the camera 5 and displayed on the monitor 6 as a thermal image. The camera 5 is slowly moved along the loom 1 so as to detect the intensity of heat emanating from the cables 2 along the loom 1. The monitor 6 displays the intensity of heat emanating from the wire along the length of the wire as a graphical image, providing datum values.

Figure 1B:
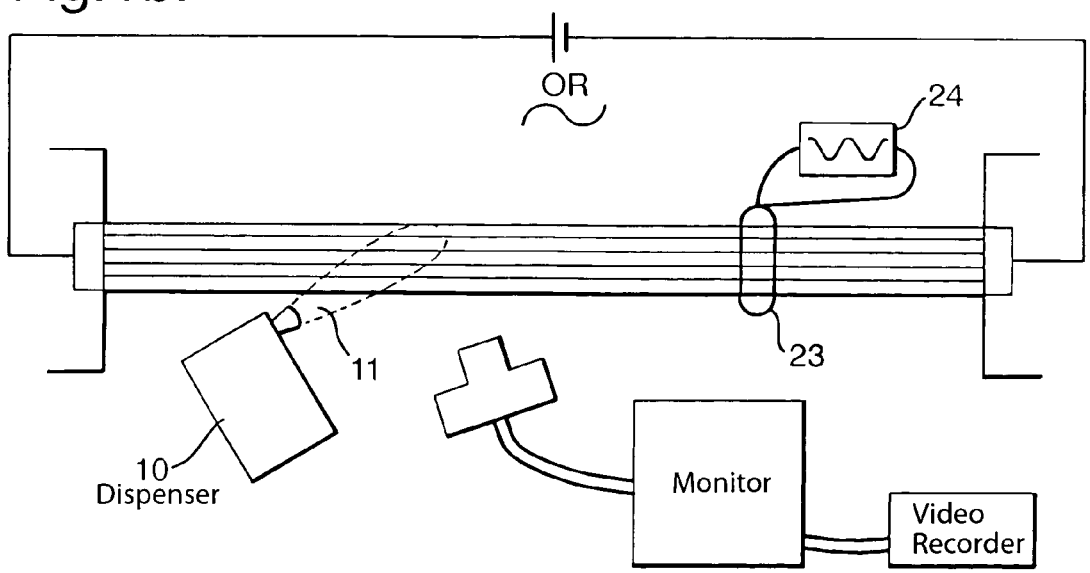

The next step of the method is described in FIG. 1b, and is advantageous in detecting areas of a loom which may be damaged but which are deep within the loom or are positioned against a structure such as a wall of an aircraft fuselage.

FIG. 1b shows the same apparatus as that shown in FIG. 1a, with the addition of a spray dispenser 10, a current clamp ammeter 23 and an oscilloscope 24. The dispenser 10 contains an electrolytic fluid 11 comprising 2% sodium chloride by mass and the wetting agent known as "Triton X100". This fluid 11 is sprayed on to the cables 2 of the loom 1 where it permeates around them wetting their outer insulation. The current clamp ammeter 23 is in contact with the loom 1 and the oscilloscope 24. The oscilloscope 24 is for displaying leakage current values.

When an electrical current is applied to the loom 1 after addition of the fluid 11, the leakage current escaping from any damage sites along the loom 1 will be conducted by the fluid 11 around the cables 2 and the loom 1 to an adjacent damage site, such that the leakage current may be detected around the circumference of the loom by the infra-red thermal imaging camera or by the current clamp ammeter 23. The leakage current may also be detected at sites adjacent the damage site as shown in FIG. 2.

Figure 2A:
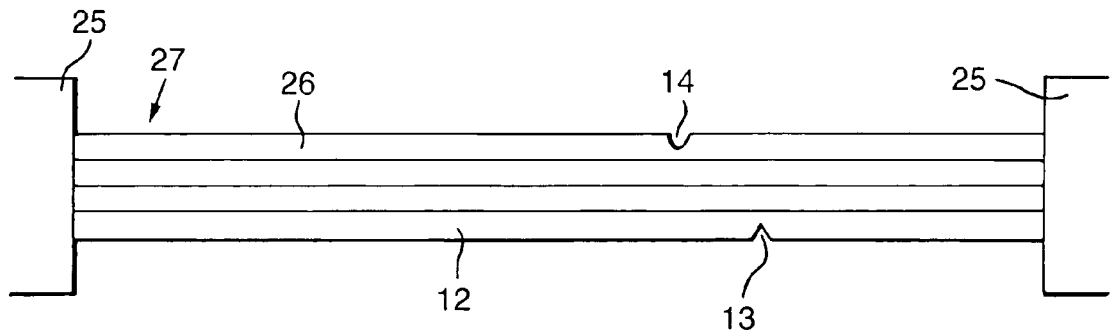
FIG. 2a shows a plan view of a loom conducting current.

FIG. 2a shows a loom 27 comprising insulated wires 12, 26 positioned between a pair of connectors 25 and conducting current therebetween. Part of the insulation of the wire 12 is damaged around its circumference 13, possibly caused by the wire 12 being tied or clipped to other wires or to a structure (not shown) at that point. The wire 26 has a radial crack 14 in its insulation, possibly caused by impact from a tool (not shown) during installation of the wire.

Figure 2B:
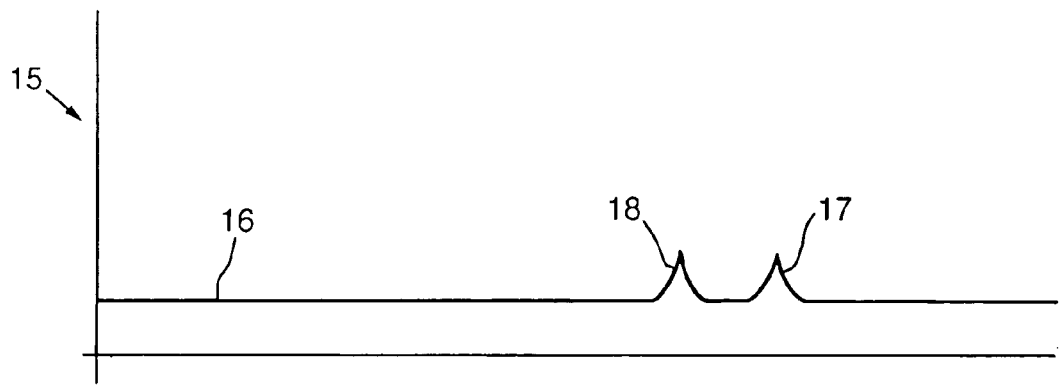
FIGS. 2b and 2c show a corresponding display of heat emanating from the wire both with and without the electrolytic fluid.

A graph 15 in FIG. 2b of intensity of heat versus distance along the loom 27 prior to the addition of an electrolyte is shown as it might appear on the display apparatus. Where the insulation of the wire 12 is undamaged, the heat intensity is at a datum level 16. Where the insulation of the wires 12, 26 have been damaged 13, 14, small peaks 17, 18 may be displayed corresponding to heat emanating from the wires 12, 26 due to the damaged insulation. Where the damage is hidden from direct view of the camera, no peaks may occur.

Figure 2C:
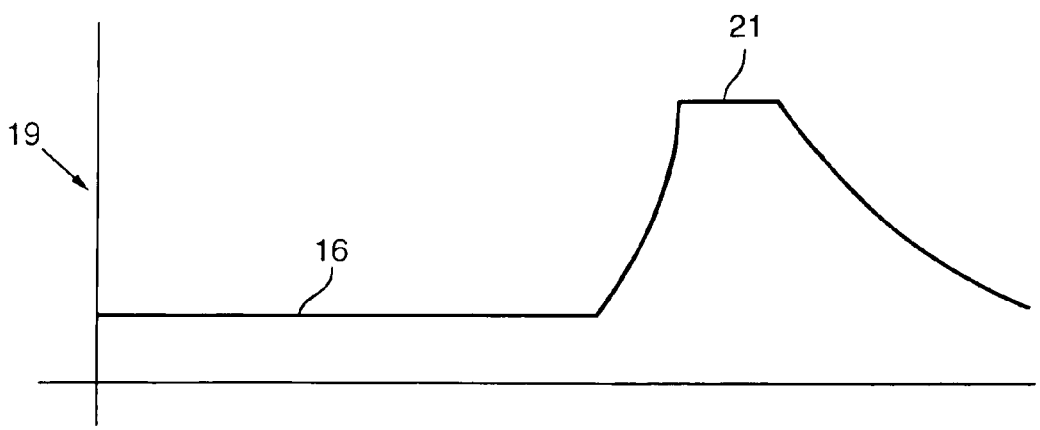

A graph 19 in FIG. 2c of intensity of heat versus distance along the loom 27 following the addition of an electrolyte (as shown in FIG. 1) is shown as it might appear on the display monitor. Where the insulation of the wires 12, 26 is undamaged the heat intensity is at a datum level 16. Where the insulation of the wires 12, 26 has been damaged at 14, a rapid temperature increase is displayed, and a higher temperature plateau 21 is shown between damage sites 13 and 14, corresponding to the heat emanating from the wires 12, 26 due to the damaged insulation and the conduction of the leakage current from the damage site 13 to adjacent damage site 14 via the electrolyte. Particularly where damage is located out of the line of sight of the detector, the addition of the electrolyte allows the leakage current to flow around the insulated wire between damage sites and so enables hidden damage sites to be detected.

FIG. 3 shows the sequence of operations in a preferred method of detecting damage to insulation of wires. The sequence proceeds in the direction of the arrows.

First a wire is connected as shown in FIG. 1 and a current is passed through it (steps 1 and 2). A camera capable of infra-red detection (as shown in FIG. 1) is moved along the length of the wire and a graph of heat intensity versus distance along the wire (as shown in FIG. 2) is displayed on a monitor (step 3).

In step 4 the display is used to establish datum values of heat emission from the wire and also gives an indication of the extent of any damage. The amount of electrolyte to be sprayed on to the wire is dependent upon the datum values of heat emission and the proximity of adjacent damage sites, as too much electrolyte could cause a short circuit and too little may not allow a leakage current to flow between adjacent damage sites, and so damage may not be detected in areas of the wire hidden from direct view.

At step 5 the electrolyte is then sprayed on to the wire, so that the insulation is wetted around the circumference of the wire. The camera is again passed over the length of the wire or is focused on particular areas of interest, according to requirement, and the result is displayed on the monitor (step 6).

The addition of the electrolyte allows a leakage current to flow between adjacent damage sites and so enhances the detection of heat emanating from damaged sites and can allow detection of damaged sites undetectable without the electrolyte (step 7). Those sites identified as having damaged insulation can then be noted for future repair or can be monitored to see if this damage becomes worse.

What is claimed is:

1. A method for inspecting the integrity of insulation of an insulated wire or cable including the steps of;
    passing a current through said wire or cable,
    applying a fluid having electrolytic properties to said wire or cable, and using a thermal imaging system to detect and display the intensity of heat emanating from said wire or cable.

2. A method for inspecting the integrity of the insulation of a wire or cable as claimed in claim 1 wherein the thermal imaging system comprises an infra-red detector and a display monitor.

3. A method for inspecting the integrity of the insulation of a wire or cable as claimed in claim 1 wherein recording means are provided for recording images displayed by the thermal imaging system.

4. A method for inspecting the integrity of the insulation of a wire or cable as claimed in claim 2 wherein the infra-red detector is a thermal imaging camera.

5. A method for inspecting the integrity of the insulation of a wire or cable as claimed in claim 2 wherein the infra-red detector is hand held.

6. A method for inspecting the integrity of the insulation of a wire or cable as claimed in claim 2 wherein the infra-red detector is stand mounted.

7. A method for inspecting the integrity of the insulation of a wire or cable as claimed in claim 2 wherein said infra-red detector is capable of detecting temperature changes of less than 0.5° C.

8. A method for inspecting the integrity of the insulation of a wire or cable as claimed in claim 3 wherein said recording means is adapted to allow displayed images to be stored on computer disks.

9. A method for inspecting the integrity of the insulation of a wire or cable as claimed in claim 3 wherein said recording means is adapted to allow images to be stored on video tape.

10. A method for inspecting the integrity of the insulation of a wire or cable as claimed in claim 3 wherein said images are displayed as calibrated spacial thermal images.

11. A method for inspecting the integrity of the insulation of a wire or cable as claimed in claim 3 wherein a false colour scale is used to represent various temperatures on displayed images.

12. A method for inspecting the integrity of the insulation of a wire or cable as claimed in claim 1 wherein said fluid is capable of conducting a leakage current.

13. A method for inspecting the integrity of the insulation of a wire or cable as claimed in claim 12 wherein leakage current measuring means are provided to measure said leakage current.

14. A method for inspecting the integrity of the insulation of a wire or cable as claimed in claim 13, wherein said leakage current measuring means comprises an ammeter.

15. A method for inspecting the integrity of the insulation of a wire or cable as claimed in claim 13, whereas said leakage current measuring means comprises an oscilloscope.

16. A method for inspecting the integrity of the insulation of a wire or cable as claimed in claim 1 wherein said fluid is an aqueous saline solution.

17. A method for inspecting the integrity of the insulation of a wire or cable as claimed in claim 1 wherein said fluid comprises sodium chloride in the range 1 to 3% by mass.

18. A method for inspecting the integrity of the insulation of a wire or cable as claimed in claim 1 wherein said fluid comprises 2% sodium chloride by mass.

19. A method of inspecting the integrity of the insulation of a wire or cable as claimed in claim 1 wherein said fluid comprises ammonium chloride in the range 1 to 3% by mass.

20. A method for inspecting the integrity of the insulation of a wire or cable as claimed in claim 1 wherein said fluid is dripped on to the wire or cable.

21. A method for inspecting the integrity of the insulation of a wire or cable as claimed in claim 1 wherein said fluid is sprayed on to the wire or cable.

22. A method for inspecting the integrity of the insulation of a wire or cable as claimed in claim 1 wherein said fluid includes a wetting agent, said wetting agent being capable of reducing the surface tension of the fluid and thereby preventing large droplets from forming.

23. A method for inspecting the integrity of the insulation of a wire or cable as claimed in claim 1 wherein said fluid is non-corrosive and is of a type that causes no substantial degradation of elastomeric polymer insulation around any wires or cables to which it is applied.

24. A method for inspecting the integrity of the insulation of a wire or cable as claimed in claim 1 wherein said thermal imaging system is used to detect and display the intensity of heat emanating from the wire or cable prior to the application of said fluid, to provide datum values of heat emission.

25. A method for inspecting the integrity of the insulation of a wire or cable as claimed in claim 24 wherein the amount of fluid used is dependent upon said datum values.

* * * * *